(12) United States Patent
Tseng

(10) Patent No.: US 8,922,300 B2
(45) Date of Patent: Dec. 30, 2014

(54) FILTER AND LAYOUT STRUCTURE THEREOF

(75) Inventor: Shih-Hsien Tseng, Hsinchu County (TW)

(73) Assignee: Cyntec Co., Ltd., Hsinchu (TW)

( * ) Notice: Subject to any disclaimer, the term of this patent is extended or adjusted under 35 U.S.C. 154(b) by 602 days.

(21) Appl. No.: 13/251,283

(22) Filed: Oct. 2, 2011

(65) Prior Publication Data

US 2012/0098620 A1 Apr. 26, 2012

(30) Foreign Application Priority Data

Oct. 25, 2010 (CN) .......................... 2010 1 0529025

(51) Int. Cl.
| | | |
|---|---|---|
| H03H 7/01 | (2006.01) | |
| H03H 7/38 | (2006.01) | |
| H03H 7/46 | (2006.01) | |
| H03H 1/00 | (2006.01) | |
| H03H 7/09 | (2006.01) | |

(52) U.S. Cl.
CPC ........... *H03H 7/0115* (2013.01); *H03H 7/1708* (2013.01); *H03H 7/1725* (2013.01); *H03H 7/1758* (2013.01); *H03H 7/38* (2013.01); *H03H 7/1775* (2013.01); *H03H 7/463* (2013.01); *H03H 2001/0085* (2013.01); *H03H 7/09* (2013.01)
USPC ........................... 333/185; 333/175; 333/176

(58) Field of Classification Search
CPC .................... H03H 7/0115; H03H 2001/0085; H03H 7/12; H03H 2007/013
USPC .................................. 333/167, 175, 176, 185
See application file for complete search history.

(56) References Cited

U.S. PATENT DOCUMENTS

| | | |
|---|---|---|
| 2007/0176727 A1 | 8/2007 | Chen |
| 2007/0290771 A1 | 12/2007 | Chen |
| 2010/0026420 A1 * | 2/2010 | Chin et al. ..................... 333/185 |

FOREIGN PATENT DOCUMENTS

JP H5-48336 2/1993

* cited by examiner

*Primary Examiner* — Benny Lee
*Assistant Examiner* — Rakesh Patel
(74) *Attorney, Agent, or Firm* — Min-Lee Teng; Litron Patent & Trademark Office

(57) ABSTRACT

A filter and a layout structure of the filter are provided. The filter includes a substrate, three capacitors, and three inductors. The three capacitors and the first and second inductors are disposed on a top surface of the substrate. The third inductor is disposed on a lateral surface of the substrate. First electrodes of the first and third capacitors and a first terminal of the first inductor are connected to a first I/O terminal of the filter. A first electrode of the second capacitor, a second electrode of the third capacitor and a first terminal of the second inductor are connected to a second I/O terminal of the filter. A first terminal of the third inductor is connected to second electrodes of the first and second capacitors.

25 Claims, 13 Drawing Sheets

FILTER AND LAYOUT STRUCTURE THEREOF

CROSS-REFERENCES TO RELATED APPLICATIONS

This application claims the priority benefit of China application serial No. 201010529025.2, filed on Oct. 25, 2010. The entirety of the above-mentioned patent application is hereby incorporated by reference herein and made a part of specification.

FIELD OF THE INVENTION

The present invention relates to a filter, and in particular, to a filter circuit and a layout structure of the filter circuit fabricated by thin film technology.

BACKGROUND OF THE INVENTION

FIG. 1 is a schematic circuit diagram of a conventional bandpass filter 100. The conventional bandpass filter 100 comprises a capacitor C1, a capacitor C2, a capacitor C3, an inductor L1 and an inductor L2. One terminal of the capacitor C1, the capacitor C3 and the inductor L1 are electrically connected to a first I/O (input/output) terminal TA of the filter 100. One terminal of the capacitor C2, the other terminal of the capacitor C3 and one terminal of the inductor L2 are electrically connected to a I/O terminal TB of the filter 100, wherein if the I/O terminal TA is an input terminal, the I/O terminal TB is an output terminal, or vice versa. The other terminal of the capacitor C1, C2, L1 and L2 are connected to a ground voltage GND. The conventional bandpass filter 100 is fabricated by LTCC (Low Temperature Co-Fired Ceramics).

FIG. 2 is a frequency-response diagram of the circuit shown in FIG. 1. The filter 100 has a resonant frequency $f_0$ in the center of the passband, and there is a notch on the left-side band of $f_0$ (which means the range smaller than $f_0$) at the position about 1.9 GHz. The notch means that the filter 100 will cause larger attenuation at the frequency herein. It can be seen clearly from FIG. 2 that the attenuation on the right-side band of $f_0$ (the range larger than $f_0$) is not as ideal as the attenuation on the left-side band of $f_0$, but this frequency response is acceptable in some application conditions. However, due to some limitation of regulations, application environments or specification of products, the attenuation on the right-side band of the resonant frequency $f_0$ of the conventional bandpass filter 100 might not meet the requirement of them. For example, some regulations or specification of products require that the attenuation near a certain frequency (such as two times the resonant frequency, i.e. $2 f_0$) on the right-side band of the resonant frequency $f_0$ should achieve a rated quantity (such as −35 dB), and it is thus very limited for the conventional bandpass filter 100 to apply.

SUMMARY OF THE INVENTION

An object of this invention is to provide a filter and a layout structure of the filter to make a notch on the right-side band of the resonant frequency $f_0$ of the frequency response.

One embodiment of the present invention provides a filter and a layout structure of the filter comprising a substrate, a first capacitor, a second capacitor, a third capacitor, a first inductor, a second inductor and a third inductor. The first, the second and the third capacitor and the first and the second inductor are disposed on the top surface of the substrate. A first electrode of the first capacitor and a first terminal of the first inductor are electrically connected to a first I/O terminal of the filter. A first electrode of the second capacitor and a first terminal of the second inductor are electrically connected to a second I/O terminal of the filter. The third capacitor is electrically connected between the first I/O terminal and the second I/O terminal of the filter. The third inductor is disposed on a first lateral surface of the substrate. A first terminal of the third inductor is electrically connected to second electrodes of the first and the second capacitors.

One embodiment of the present invention provides a filter comprising a first capacitor, a second capacitor, a third capacitor, a first inductor, a second inductor and a third inductor. A first electrode of the first capacitor and a first terminal of the first inductor are electrically connected to a first I/O terminal of the filter. A first electrode of the second capacitor and a first terminal of the second inductor are electrically connected to a second I/O terminal of the filter. The third capacitor is electrically connected between the first and the second I/O terminals of the filter. A first terminal of the third inductor is electrically connected to second electrodes of the first and the second capacitors, and a second terminal of the third inductor is electrically connected to a reference voltage.

Based on the above, thin film technology can be used to achieve the layout structure of the filter circuit according to the embodiment of the present invention so as to reduce costs. Moreover, the filter circuit provided according to the embodiment of the present invention has a notch on the right-side band of the resonant frequency $f_0$ of the frequency response.

The detailed technology and above preferred embodiments implemented for the present invention are described in the following paragraphs accompanying the appended drawings for people skilled in this field to well appreciate the features of the claimed invention.

BRIEF DESCRIPTION OF THE DRAWINGS

The foregoing aspects and many of the accompanying advantages of this invention will become more readily appreciated as the same becomes better understood by reference to the following detailed description when taken in conjunction with the accompanying drawings, wherein.

DETAILED DESCRIPTION OF THE INVENTION

The detailed explanation of the present invention is described as following. The described preferred embodiments are presented for purposes of illustrations and descriptions, and they are not intended to limit the scope of the present invention.

Figure 1:
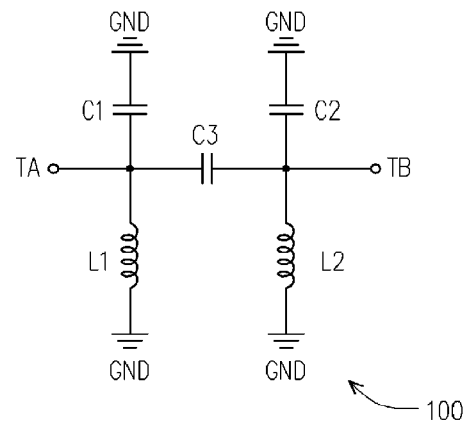
FIG. 1 is a schematic circuit diagram of a conventional bandpass filter.
Figure 2:
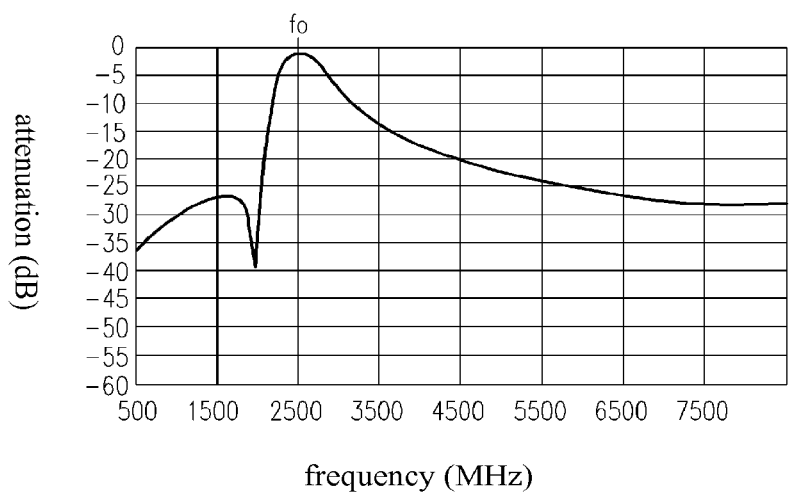
FIG. 2 is a frequency response diagram of the circuit shown in FIG. 1.
Figure 3:
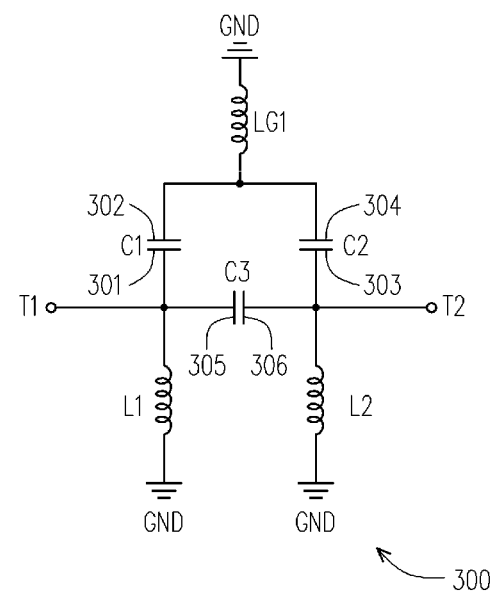
FIG. 3 is a schematic circuit diagram of a filter according to one embodiment of the present invention.

FIG. 3 is a schematic diagram of a filter 300 according to one embodiment of the present invention. The filter 300 comprising a capacitor C1, a capacitor C2, a capacitor C3, a inductor L1, a inductor L2 and a inductor LG1. An electrode 301 of the capacitor C1 is electrically connected to an I/O terminal T1 of the filter 300. An electrode 303 of the capacitor C2 is electrically connected to a I/O terminal T2 of the filter 300, wherein if the I/O terminal T1 is an input terminal, the I/O terminal T2 is an output terminal, or vice versa. An electrode 305 of the capacitor C3 is electrically connected to the I/O terminal T1 of the filter 300 and an electrode 306 of the capacitor C3 is electrically connected to the I/O terminal T2 of the filter 300. A first terminal of the inductor LG1 is electrically connected to a second electrode 302 of the capacitor C1 and a second electrode 304 of the capacitor C2, and a second terminal of the inductor LG1 is electrically connected to a first reference voltage (such as a ground voltage GND or other fixed voltages). A first terminal of the inductor L1 is electrically connected to the I/O terminal T1 of the filter 300. A first terminal of the inductor L2 is electrically connected to the I/O terminal T2 of the filter 300. Mutual inductance can be generated by interactive coupled magnetic field between the inductor L1 and the inductor L2. Second terminals of the inductor L1 and the inductor L2 are connected to a second reference voltage (such as a ground voltage GND or other fixed voltages), wherein at least either the first reference voltage is a ground voltage or the second reference voltage is a ground voltage. The filter 300 can make a notch on the right-side band of the resonant frequency $f_0$ of the frequency response (such as the notch 502 in FIG. 5). The frequency of the notch 502 can be changed by modifying capacitance of the capacitors C1, C2 and C3 or modifying inductance of the inductor LG1. For example, inductance of the inductor LG1 can be 0.01~0.1 times inductance of the inductor L1 or the inductor L2.

Figure 4:
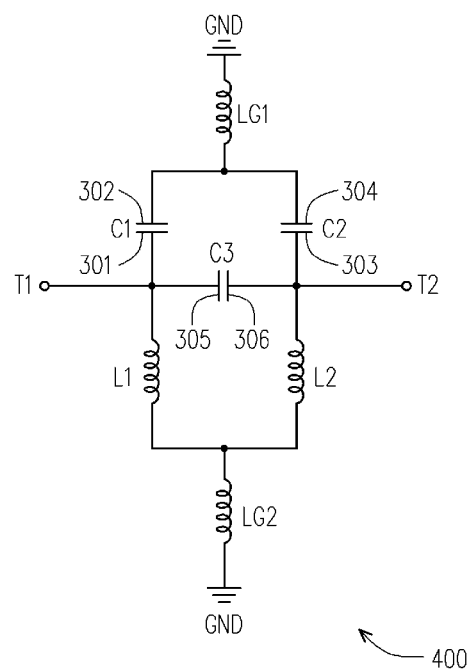
FIG. 4 is a schematic circuit diagram of a filter according to another embodiment of the present invention.

FIG. 4 is a schematic diagram of a filter 400 according to another embodiment of the present invention. A difference between the filter 300 and the filter 400 is that the filter 400 further comprises an inductor LG2. A first terminal of the inductor LG2 is electrically connected to second terminals of the inductor L1 and the inductor L2, and a second terminal of the inductor LG2 is electrically connected to a third reference voltage (such as a ground voltage GND or other fixed voltages), wherein at least either the first reference voltage is a ground voltage or the third reference voltage is a ground voltage. The position of the notch 502 can also be changed by modifying an inductance of the inductor LG2. For example, an inductance of the inductor LG2 can be 0.01~0.1 times an inductance of the inductor L1 or the inductor L2.

Figure 5:
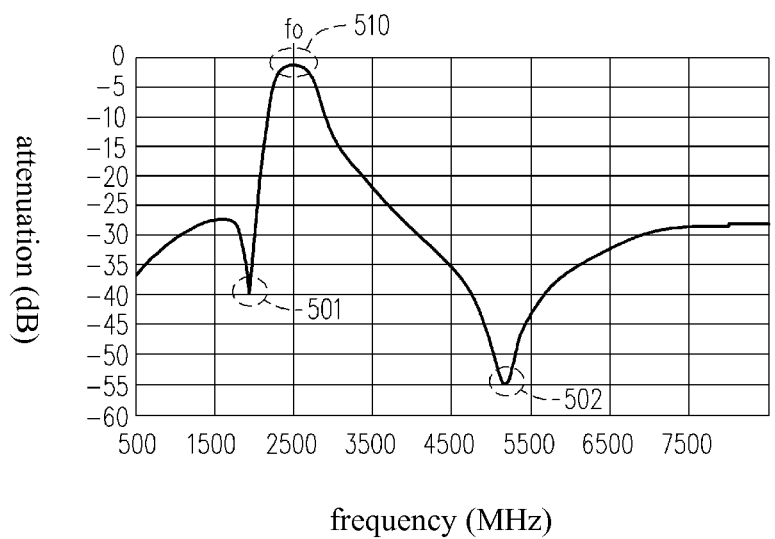
FIG. 5 is a frequency response diagram of the circuit shown in FIG. 4.

FIG. 5 is a characteristic-curve-of-frequency-response diagram of the filter 400 shown in FIG. 4. The filter 400 has a resonant frequency $f_0$ in the center of the passband, and there are a first notch 501 and a second notch 502 on the left-side band (the range smaller than $f_0$) and the right-side band (the range larger than $f_0$) of $f_0$ respectively. A notch is a frequency at which it has larger attenuation in the filter 400. For example, the resonant frequency $f_0$ is about 2.5 GHz; the frequency of the first notch 501 is about 1.8 GHz, and the attenuation herein is about −36 dB; the frequency of the second notch 502 is about 5 GHz, and the attenuation herein is about −54 dB.

Comparing to the conventional filter 100, the filter 400 can make the second notch 502 on the right-side band of the resonant frequency $f_0$ of the frequency response. The frequency of the notch 502 can be changed by modifying capacitance of the capacitors C1, C2 and C3 or modifying the inductance of the inductors LG1 and LG2. If the inductance of the inductor LG1 or the inductor LG2 is increased, the frequencies of the notch 501 and 502 will be close to (approach) the resonant frequency $f_0$, and the attenuation at the notch 501 and 502 will decrease slightly (i.e. moving up along the Y axis in FIG. 5). Otherwise, if the inductance of the inductor LG1 or the inductor LG2 is decreased, the frequencies of the notch 501 and 502 will be far from (leave) the resonant frequency $f_0$, and the attenuation at the notch 501 and 502 will increase slightly (i.e. moving down along the Y axis in FIG. 5). The frequency of the second notch 502 can be determined according to design requirements. For example, the filter 400 can make the frequency of the second notch 502 around a double resonant frequency (i.e. $2f_0$) to meet the needs of the regulations or specification of products.

Figure 6:
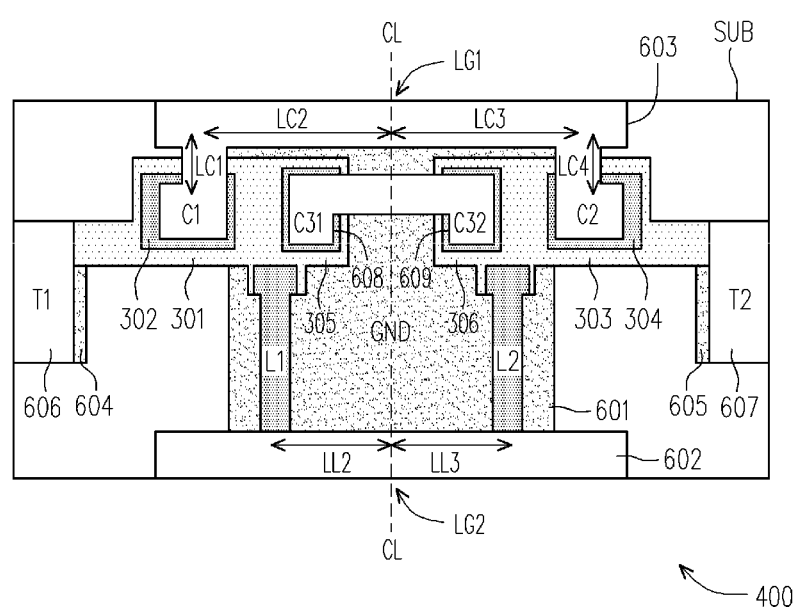
FIG. 6 is a top view of a layout structure of the filter shown in FIG. 4 according to the embodiment of the present invention.
Figure 7:
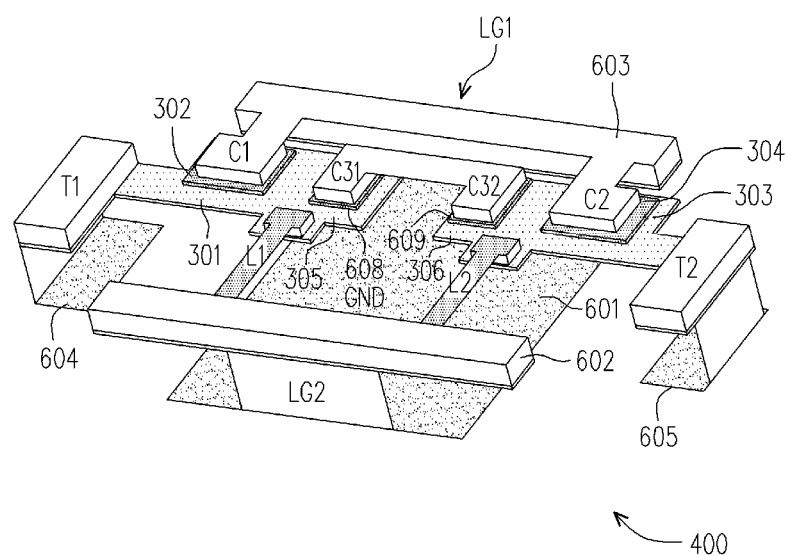
FIG. 7 is a perspective view of the layout structure shown in FIG. 6.
Figure 8:
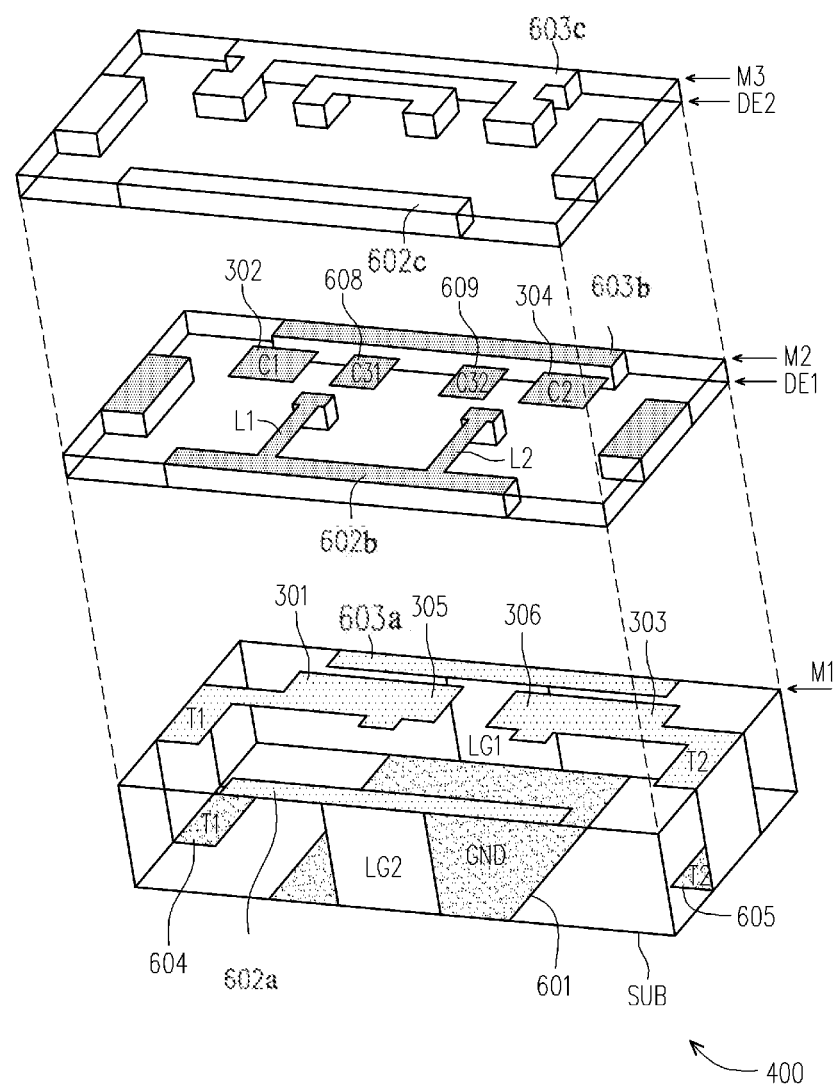
FIG. 8 is an explosion diagram of the layout structure shown in FIG. 7.

Those skilled in the art will readily realize the filter 300 and the filter 400 by any manufacturing process and any layout structure in light of the teaching of the foregoing embodiment. For example, FIG. 6 is a top view of the layout structure of the filter 400 shown in FIG. 4. FIG. 7 is a perspective view of the layout structure shown in FIG. 6, and FIG. 8 is an explosion diagram of the layout structure shown in FIG. 7. The layout of the filter 400 comprising a substrate SUB, a capacitor C1, a capacitor C2, a capacitor C3, a inductor L1, a inductor L2, a inductor LG1, a inductor LG2 and a soldering pad 601. The capacitors C1, C2 and C3 and the inductors L1 and L2 are disposed on the top surface of the substrate SUB. The capacitor C1 and the capacitor C2 are symmetrically disposed on both sides of a central line CL, and the inductor L1 and the inductor L2 are symmetrically disposed on both sides of the central line CL as well. In this embodiment, the geometrical shape of the inductor L1 and the inductor L2 are both long-straight wires as shown in FIG. 6~FIG. 8, and inductance of the inductors L1 and L2 can be determined by changing the length and width of the wires.

Figure 9:
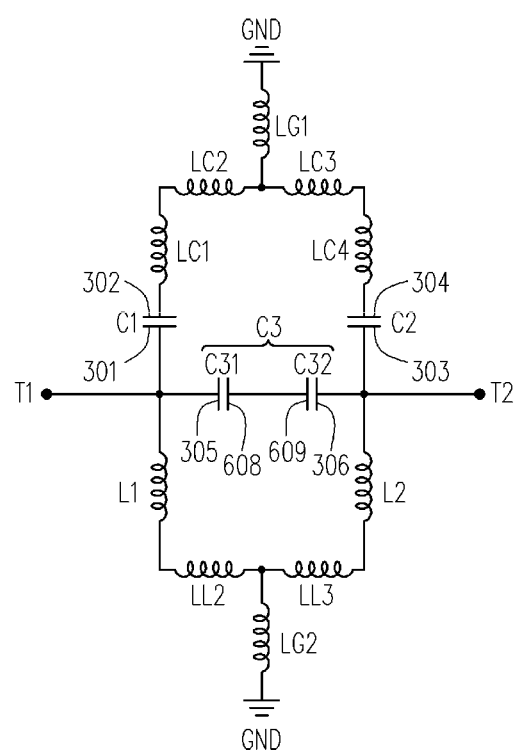
FIG. 9 is an equivalent circuit diagram of the layout structure shown in FIG. 6.

FIG. 9 is an equivalent circuit diagram of the layout structure of the filter 400 shown in FIG. 6. Please refer to FIG. 6~FIG. 9, the capacitor C3 of the filter 400 is performed by a capacitor C31 and a capacitor C32 in series due to layout consideration. An electrode 305 of the capacitor C31 is electrically connected to an I/O terminal T1 of the filter 400. An electrode 609 of the capacitor C32 is electrically connected to an electrode 608 of the capacitor C31, and an electrode 306 of the capacitor C32 is electrically connected to an I/O terminal T2 of the filter 400. The capacitor C31 and the capacitor C32 are symmetrically disposed on both sides of the central line CL.

A conducting wire 603 is disposed on a first edge of the top surface of the substrate SUB, wherein the first edge is adjacent to a first lateral surface of the substrate SUB, and the inductor LG1 is disposed on the first lateral surface. In this embodiment, the geometrical shape of the inductor LG1 is a vertical wire, and inductance of the inductor LG1 can be determined by changing the width of the vertical wire. The central portion of the conducting wire 603 is connected to a terminal of the inductor LG1. Each end of the conducting wire 603 has an extending portion; and each extending portion is connected to an electrode 302 of the capacitor C1 and an electrode 304 of the capacitor C2 respectively. Therefore, the inductor LG1 can be electrically connected to the electrode 302 of the capacitor C1 and the electrode 304 of the capacitor C2 through the conducting wire 603. In a high-frequency application environment, the conducting wire 603 can be regarded as inductors LC2 and LC3, and each of the extending portions of the conducting wire 603 can be regarded as inductors LC1 and LC4 respectively.

A conducting wire 602 is disposed on a second edge of the top surface of the substrate SUB, wherein the second edge is adjacent to a second lateral surface of the substrate SUB, and the inductor LG2 is disposed on the second lateral surface. In this embodiment, the geometrical shape of the inductor LG2 is a vertical wire, and inductance of the inductor LG2 can be determined by changing the width of the vertical wire. The central portion of the conducting wire 602 is connected to a first terminal of the inductor LG2. A first terminal and a second terminal of the conducting wire 602 are connected to a second terminal of the inductor L1 and a second terminal of the inductor L2 respectively. In a high-frequency application environment, the conducting wire 602 can be regarded as inductors LL2 and LL3.

A soldering pad 601, a soldering pad 604 and a soldering pad 605 are disposed on the bottom surface of the substrate SUB. The soldering pad 604 is electrically connected to the I/O terminal T1 of the filter 400. The soldering pad 605 is electrically connected to the I/O terminal T2 of the filter 400. The soldering pad 601 is electrically connected to second terminals of the inductor LG1 and the inductor LG2. The soldering pad 601 can be electrically connected to any reference voltage (such as a ground voltage GND or other fixed voltages) according to design requirements.

The process of fabricating the filter 400 is described as the following. Please refer to FIG. 8, providing a substrate SUB first, which can be made of glass, ceramics, bakelite, plastics or other insulating materials, such as Aluminum oxide ($Al_2O_3$). Then, form a first conducting layer M1 on the substrate SUB and pattern it to form the electrode 301 of the capacitor C1, the electrode 305 of the capacitor C31, the electrode 306 of the capacitor C32, the electrode 303 of the capacitor C2, the conducting segment 603a, the conducting segment 602a, the I/O terminals T1 and T2 of the filter 400. The material of the first conducting layer M1 is mainly low-resistance material (e.g., Al, Cu, or Ag). The first conducting layer M1 can be formed by conventional methods.

Next, form a first insulating layer DE1 on the first conducting layer M1 and pattern it to optionally form dielectric windows. The first insulating layer DE1 can be made of organic, inorganic or hybrid materials, such as $SiO_2$, SiNx, SiON, polyimide-based or acrylic-based (acrylic). The first insulating layer DE1 can be formed by conventional methods, such as CVD (chemical vapor deposition), sputtering, spin coating or coating. Next, form a second conducting layer M2 on the first insulating layer DE1 and pattern it to form the electrode 302 of the capacitor C1, the electrode 608 of the capacitor C31, the electrode 609 of the capacitor C32, the electrode 304 of the capacitor C2, the conducting segment 603b, the conducting segment 602b, the inductor L1 and the inductor L2, and form dielectric window vias in the dielectric windows of the first insulating layer DE1. The terminals of the inductor L1 and the inductor L2 can be electrically connected to the I/O terminal T1 and the I/O terminal T2 of the filter 400 through the dielectric window vias respectively. The material, thickness and manufacturing process of the second conducting layer M2 can be the same as that of the first conducting layer M1.

Next, form a second insulating layer DE2 on the second conducting layer M2 and pattern it to optionally form dielectric windows. The material, thickness and manufacturing process of the second insulating layer DE2 can be the same as that of the first insulating layer DE1. Then, form a third conducting layer M3 on the second insulating layer DE2 and pattern it to form the conducting segment 603c, the conducting segment 602c and interconnects, and form dielectric window vias in the dielectric windows of the second insulating layer DE2. The material, thickness and manufacturing process of the third conducting layer M3 can be the same as that of the first conducting layer M1.

The conducting segments 603a, 603b, 603c, 602a, 602b and 602c of the conducting wire 603 and the conducting wire 602 on each conducting layer can be electrically connected through the dielectric window vias. The electrode 608 of the capacitor C31 is electrically connected to the electrode 609 of the capacitor C32 through the dielectric window vias and the interconnects. The conducting wire 603 is electrically connected to the electrode 302 of the capacitor C1 and the electrode 304 of the capacitor C2 through the dielectric window vias.

Next, form the inductor LG1 on the first lateral surface of the substrate SUB, and form the inductor LG2 on the second lateral surface of the substrate SUB. In this embodiment, the inductor LG1 and the inductor LG2 are symmetrical with respect to the central line CL. Sometimes, process error may induce misalignment based on the central line CL of the inductor LG1 and the inductor LG2 (i.e. the values of parasitic inductance LL2 and LL3 are not equal). To improve the forgoing problem of process error, the positions of the inductor LG1 and the inductor LG2 can not be adjacent to the edges of the substrate SUB. The following takes the inductor LG2 for an example, by which the inductor LG1 can be referred.

Those implementing this invention can moderately modify the layout structure shown in FIG. 8 according to the teaching of the foregoing embodiment or design requirements. In one example, dispose the electrode 608 of the capacitor C31 and the electrode 609 of the capacitor C32 in the third conducting layer M3. In another example, dispose the electrode 608 in the second conducting layer M2 and dispose the electrode 609 in the third conducting layer M3. In yet another example, dispose the electrode 608 in the third conducting layer M3 and dispose the electrode 609 in the second conducting layer M2.

In one example, dispose the electrode 302 of the capacitor C1 and the electrode 304 of the capacitor C2 in the third conducting layer M3. In another example, dispose the electrode 302 in the second conducting layer M2 and dispose the electrode 304 in the third conducting layer M3. In yet another example, dispose the electrode 302 in the third conducting layer M3 and dispose the electrode 304 in the second conducting layer M2.

In one example, dispose the inductor L1 and the inductor L2 in the third conducting layer M3. In another example, dispose the inductor L1 in the second conducting layer M2 and dispose the inductor L2 in the third conducting layer M3. In yet another example, dispose the inductor L1 in the third conducting layer M3 and dispose the inductor L2 in the second conducting layer M2. No matter in which layer the inductor L1 and the inductor L2 are disposed, the terminals of the inductor L1 and the inductor L2 can both be electrically connected to the first I/O and the second I/O terminals of the filter 400 through its dielectric window vias respectively.

Figure 10:
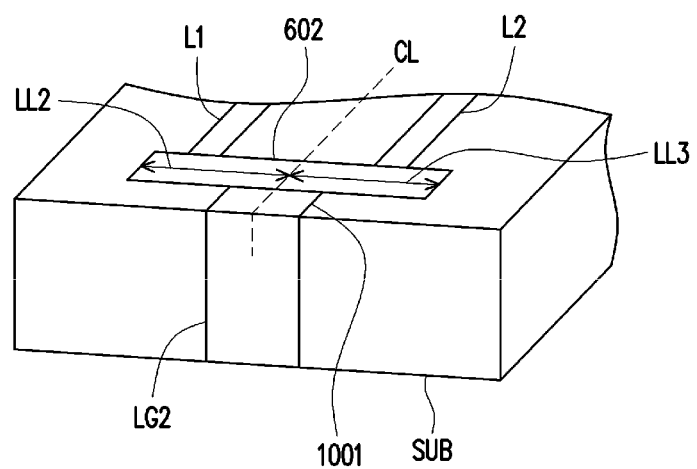
FIG. 10 is a perspective view of parts of the layout structure of the filter shown in FIG. 4 according to another embodiment of the present invention.

FIG. 10 is a perspective view of portions of the layout structure of the filter 400 shown in FIG. 4 according to another embodiment of the present invention. What isn't shown and described in this embodiment can be referred by the description in FIG. 6~FIG. 8. The difference between this embodiment and the layout structure shown in FIG. 6~FIG. 8 is that the second conducting wire 602 shown in FIG. 10 isn't adjacent to the edge of the substrate SUB. There is a small distance between the edge of the conducting wire 602 disposed on the top surface of the substrate SUB and the edge of the substrate SUB. A central portion of the conducting wire 602 has a central extending portion 1001, which extends to the edge of the substrate SUB to connect to the inductor LG2. The inductor L1 and the inductor L2 are connected by the conducting wire 602. Likewise, the first conducting wire 603 in this embodiment isn't adjacent to the edge of the substrate SUB, and there is a small distance between the edge of the conducting wire 603 and the edge of the substrate SUB. A central portion of the conducting wire 603 also has a central extending portion, which extends to a terminal of the inductor LG1. Each of the two ends of the conducting wire 603 has an extending portion to connect an electrode of the capacitor C1 and an electrode of the capacitor C2 respectively. Therefore, although there is misalignment with the central line CL of the inductor LG2 (or the inductor LG1) due to process error, the values of parasitic inductance LL2 and LL3 are still substantially equal, and the foregoing problem of process error can thus be effectively improved in this embodiment.

In the abovementioned description, the inductance of the inductor LG1 and the inductor LG2 is determined by design requirements. In one example, in the foregoing embodiment, total inductance of the inductor LG1 and the central extending portion of the conducting wire 603 is 0.01~0.1 times the inductance of the first inductor L1 or the inductor L2. In another example, total inductance of the inductor LG2 and the central extending portion 1001 of the conducting wire 602 is 0.01~0.1 times the inductance of the inductor L1 or the inductor L2.

Thin film technology can be used to perform the layout structure of the filter circuit described in the foregoing embodiments of this invention so that total manufacturing cost can be reduced. Furthermore, the filter circuit in the foregoing embodiments of this invention can make a notch on the right-side band of the resonant frequency $f_0$ of frequency response.

Figure 11:
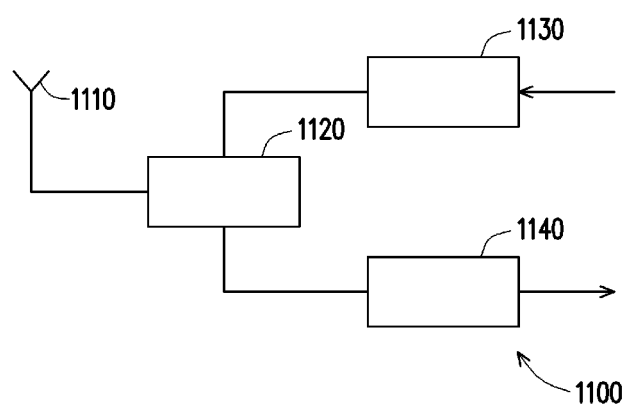
FIG. 11 is a block diagram of a communication system according to one embodiment of the present invention.

The abovementioned filter 300 and filter 400 can be applied in any system, for example, a communication system. FIG. 11 is a block diagram of a communication system 1100 according to one embodiment of the present invention. The communication system 1100 comprises an antenna 1110, a matching network 1120, a duplexer 1130 and a duplexer 1140. The duplexer 1130 transmits signals to the antenna 1110; the duplexer 1140 receives the signals from the antenna 1110. The matching network 1120 is also called impedance-matching circuit. The matching network 1120 can provide matching impedance, and improve the isolation of the foregoing transmitting and receiving of the signals. The foregoing filter circuit 300 and filter circuit 400 can be used as the matching network 1120 in the communication system 1100. For example, connect the I/O terminal T1 of the filter 400 to the antenna 1110, and connect the I/O terminal T2 of the filter 400 to the duplexer 1130 or the duplexer 1140.

Figure 12:
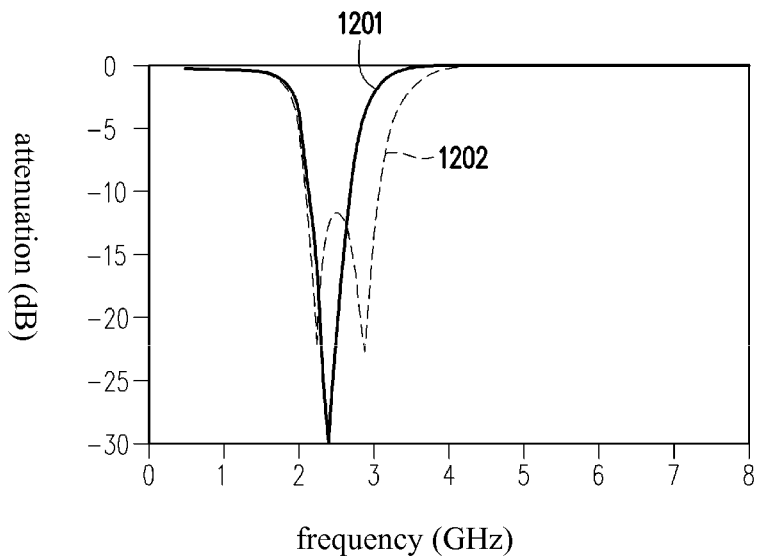
FIG. 12 is a frequency response diagram of the matching network shown in FIG. 11.

FIG. 12 is a frequency-response diagram of the matching network 1120 shown in FIG. 11. The filter 400 is used in the matching network 1120 shown in FIG. 11 herein. By increasing inductance of the inductors LG1 and LG2, the impedance of the matching network 1120 will increase, and the impedance band can be made narrower, as shown in the curve 1201. On the contrary, by decreasing inductance of the inductors LG1 and LG2, the impedance of the matching network 1120 will decrease, and the impedance band can be made broader, as shown in the curve 1202.

In some application, the method or process of manufacturing the matching network 1120 may not be the same as that of the duplexers 1130 and 1140. The matching network and the duplexers can be different package components, and a larger area of PCB (printed circuit board) may be occupied. The duplexers 1130 and 1140 can be stacked on the matching network 1120 (i.e. the filter 400), and the matching network and the duplexers can be in a single package component to save the area of PCB.

Figure 13:
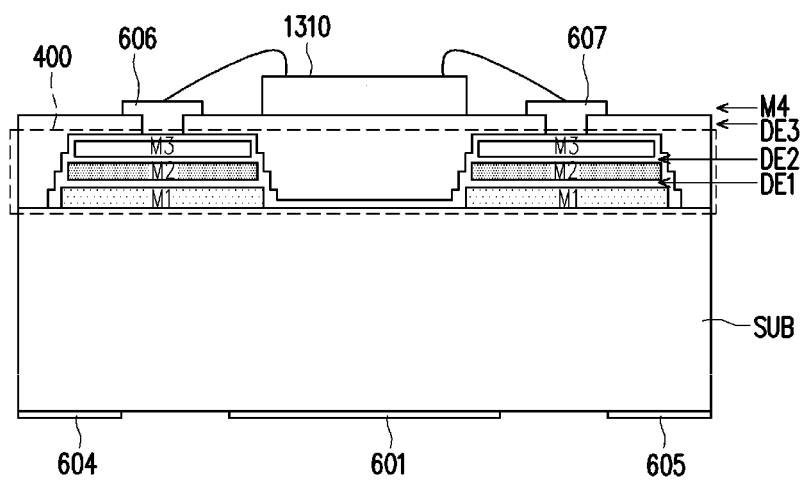
FIG. 13 is a cross-sectional view of the filter shown in FIG. 6 according to the embodiment of the present invention.

FIG. 13 is a cross-sectional view of the filter 400 shown in FIG. 6. In some embodiment, those skilled in the art can further dispose a third insulating layer DE3 on the third conducting layer M3 according to design requirements and pattern it to form dielectric windows; and dispose a fourth conducting layer M4 on the third insulating layer DE3 and pattern it to form a die area, a soldering pad 606 and a soldering pad 607. The soldering pad 606 is electrically connected to the I/O terminal T1 of the filter 400 through the dielectric window vias; the soldering pad 607 is electrically connected to the I/O terminal T2 of the filter 400 through the dielectric window vias. A die 1310, such as a duplexer die, can be placed in the die area, and the duplexer 1130 or the duplexer 1140, as shown in FIG. 11, can be included in the duplexer die 1310. The soldering pad 606 and the soldering pad 607 are electrically connected to the duplexer die 1310 by wire bonding. Therefore, by stacking the duplexers 1130 and 1140 on the matching network 1120 (i.e. the filter 400), the matching network and the duplexers made by different method (or process) can be in a single package component to reduce costs and save the area of PCB.

Figure 14:
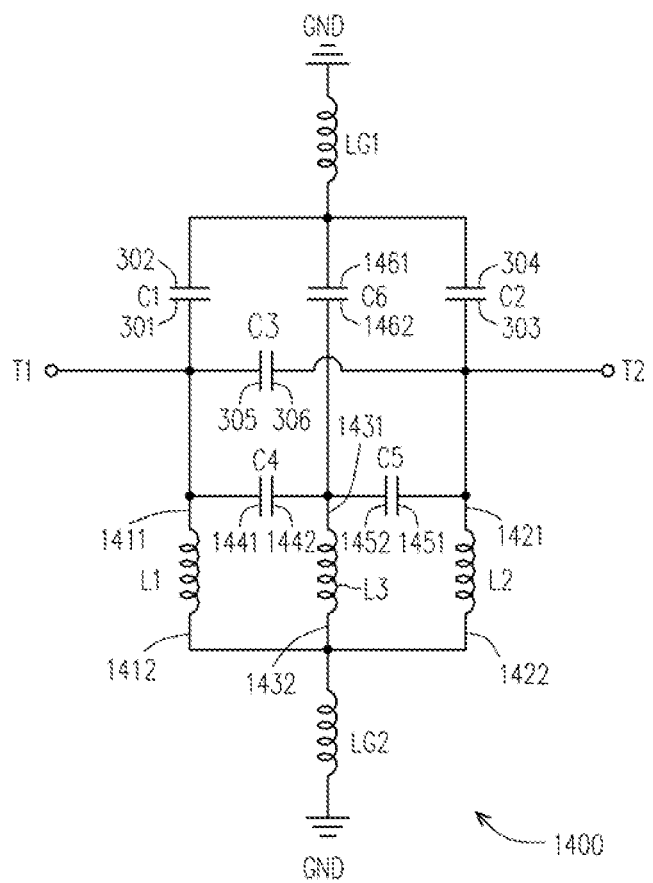
FIG. 14 is a schematic circuit diagram of a filter according to yet another embodiment of the present invention.

FIG. 14 is a schematic circuit diagram of a filter circuit 1400 according to yet another embodiment of the present invention. This embodiment illustrated in FIG. 14 can be easier to understand by referring to FIG. 4. The difference between the filter 400 and the filter 1400 is that the filter 1400 further comprises a capacitor C6, an inductor L3, a capacitor C4 and a capacitor C5. An electrode 1461 of the capacitor C6 is electrically connected to a terminal of the inductor LG1. An electrode 1462 of the capacitor C6 is electrically connected to a terminal 1431 of the inductor L3. A terminal 1432 of the inductor L3 is electrically connected to a terminal of the inductor LG2. The electrode 301 of the capacitor C1, an electrode 1441 of the capacitor C4 and a terminal 1411 of the inductor L1 are electrically connected to an I/O terminal T1 of the filter 1400. The electrode 303 of the capacitor C2, a electrode 1451 of the capacitor C5 and a terminal 1421 of the inductor L2 are electrically connected to a I/O terminal T2 of the filter 1400, wherein if the I/O terminal T1 is an input terminal, the I/O terminal T2 is an output terminal, and vice versa. An electrode 1442 of the capacitor C4 and an electrode 1452 of the capacitor C5 are electrically connected to an electrode 1462 of the capacitor C6 and a terminal 1431 of the inductor L3.

Comparing to the filter 300, the filter 1400, as illustrated in FIG. 14, comprises not only the first capacitor-inductor pair (the capacitor C1 and the inductor L1) and the second capacitor-inductor pair (the capacitor C2 and the inductor L2) but also the third capacitor-inductor pair (the capacitor C6 and the inductor L3). Mutual inductance can be generated by interactive coupled magnetic field between the inductor L1, the inductor L2 and the inductor L3.

Capacitance of the C6 can be equal to capacitance of C1 or C2; capacitance of the C4 or C5 can be equal to capacitance of C3; inductance of the inductor L3 can be equal to inductance of the inductors L1 and L2. Because the third capacitor-inductor pair (the capacitor C6 and the inductor L3) is added, the attenuation at the resonant frequency can be increased. Taking FIG. 5 for an example, the notch 501 and 502 can be pulled down.

Figure 15:
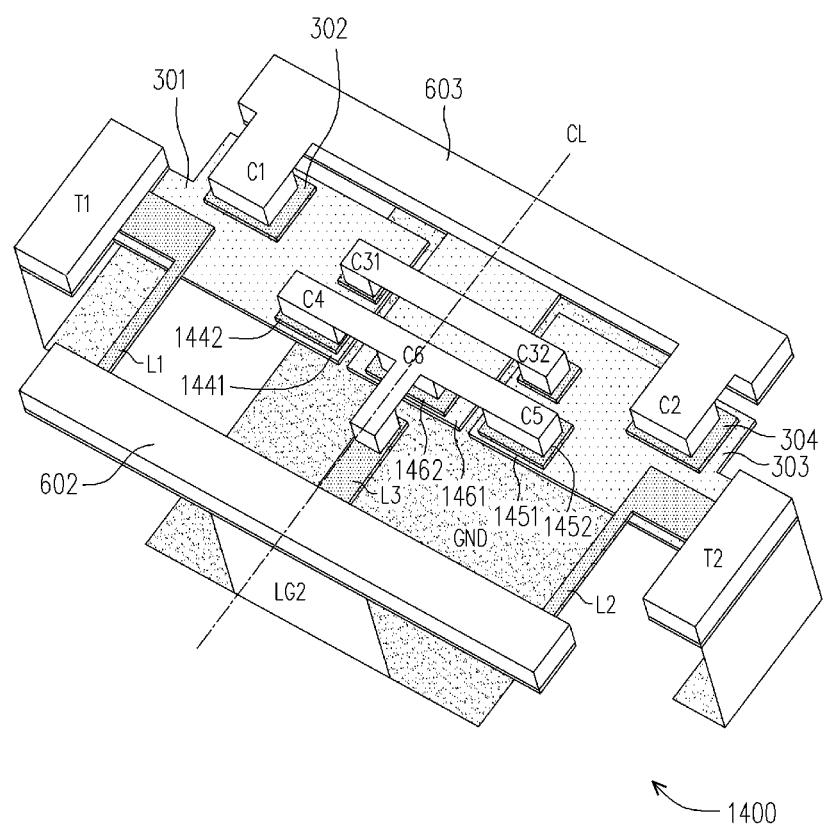
FIG. 15 is a perspective view of the layout structure of the filter shown in FIG. 14 according to the embodiment of the present invention.
Figure 16:
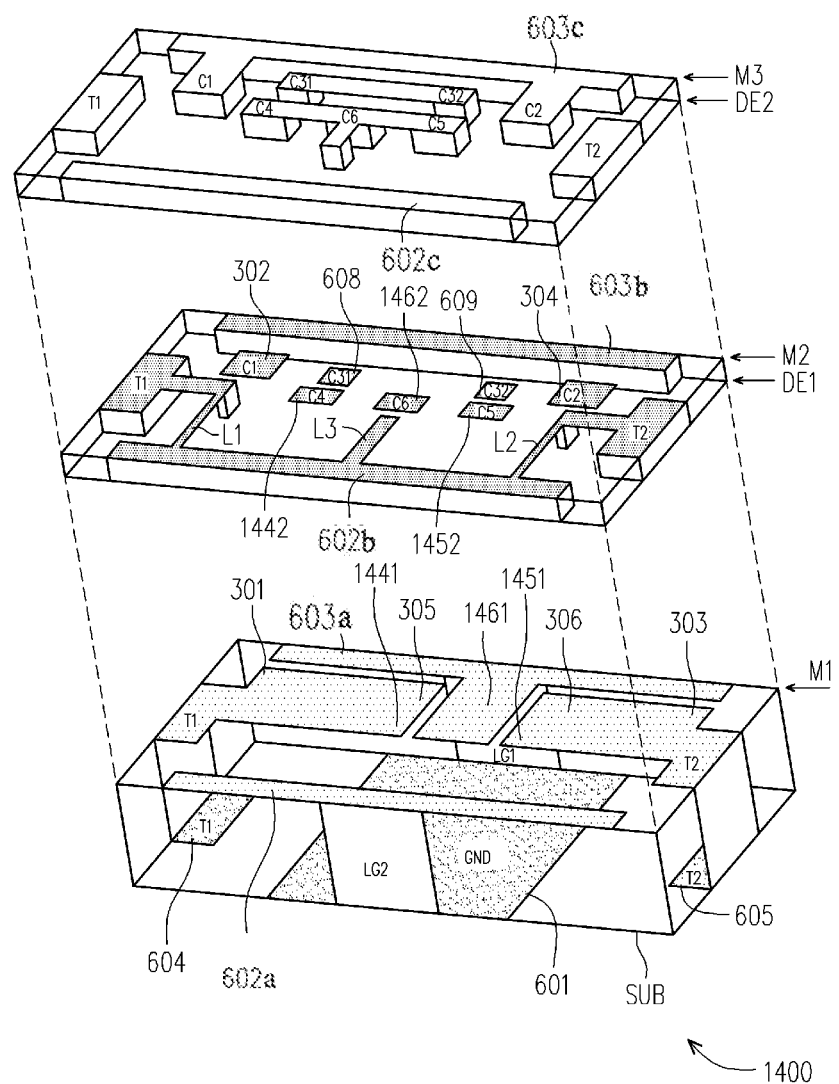
FIG. 16 is an explosion diagram of the layout structure shown in FIG. 15.

Those skilled in the art will readily realize the filter 1400 by any manufacturing process and any layout structure in light of the teaching of the foregoing embodiment. For example, FIG. 15 is a perspective view of the layout structure of the filter 1400 shown in FIG. 14, FIG. 16 is an explosion diagram of the layout structure shown in FIG. 15. The layout of the filter 1400 can be easier to understand by referring to the description of the filter 300 and the filter 400. The difference between the filter 1400 and the filter 400 is that the layout structure of the filter 1400 further comprises an inductor L3, a capacitor C6, a capacitor C4 and a capacitor C5. The capacitors C4, C5, C6 and L3 are disposed on the top surface of the substrate SUB. The capacitor C4 and the capacitor C5 are symmetrically disposed on both sides of a central line CL, and the inductor L3 is symmetrically disposed on the central line CL. In this embodiment, the geometrical shapes of the inductor L1, L2 and L3 are long-straight wires as shown in FIG. 15~FIG. 16, and inductance of the inductors L1, L2 and L3 can be determined by changing the length and width of the wires.

Please referring to FIG. 14~FIG. 16, the electrode 1441 of the capacitor C4 is electrically connected to the I/O terminal T1 of the filter 1400. The electrode 1442 of the capacitor C4 is electrically connected to the electrode 1462 of the capacitor C6, the electrode 1452 of the capacitor C5 and the terminal 1431 of the inductor L3 through the interconnects and the dielectric window vias.

Those implementing this invention can moderately modify the layout structure shown in FIG. 15 and FIG. 16 according to the teaching of the foregoing embodiments or design requirements. In one example, dispose the electrode 1442 of the capacitor C4, the electrode 1452 of the capacitor C5 and the electrode 1462 of the capacitor C6 in the second conducting layer M2. In another example, dispose the electrode 1442, the electrode 1452 and the electrode 1462 in the third conducting layer M3. In yet another example, dispose the electrode 1442, the electrode 1452 and the electrode 1462 in different layers, such as disposing the electrode 1442 and 1452 in the second conducting layer M2 and disposing the electrode 1462 in the third conducting layer M3.

In one example, dispose the inductor L3 in the second conducting layer M2. In another example, dispose the inductor L3 in the third conducting layer M3. No matter in which layer the inductor L3 is disposed, the terminal 1431 of the inductor L3 can be electrically connected to the electrode 1442, the electrode 1452 and the electrode 1462 through the dielectric window vias and the interconnects.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A filter circuit, comprising:
a first I/O terminal;
a second I/O terminal;
a first capacitor having a first electrode and a second electrode, wherein the first electrode is electrically coupled to the first I/O terminal;
a second capacitor having a third electrode and a fourth electrode, wherein the third electrode is electrically coupled to the second I/O terminal;
a third capacitor having a fifth electrode and a sixth electrode, wherein the fifth electrode is electrically coupled to the first I/O terminal and the sixth electrode is electrically coupled to the second I/O terminal;
a first inductor having a first terminal and a second terminal, wherein the first terminal is electrically coupled to the first I/O terminal and the second terminal is electrically coupled to a first reference voltage;
a second inductor having a third terminal and a fourth terminal, wherein the third terminal is electrically coupled to the second I/O terminal and the fourth terminal is electrically coupled to a second reference voltage; and
a third inductor having a fifth terminal and a sixth terminal, wherein the fifth terminal is electrically coupled to the second electrode and the fourth electrode, and the sixth terminal is electrically coupled to a third reference voltage, wherein the second electrode and the fourth electrode are coupled to the third reference voltage through the third inductor without passing through the second terminal and the fourth terminal;
wherein the first I/O terminal is an input terminal and the second I/O terminal is an output terminal, or the second I/O terminal is an input terminal and the first I/O terminal is an output terminal; and the frequency response of the filter circuit comprises a resonant frequency, a first notch on a lower frequency side of the frequency response and a second notch on a higher frequency side of the frequency response.

2. The filter circuit according to claim 1, further comprising a fourth inductor having a seventh terminal and an eighth terminal, wherein the second terminal, fourth terminal and the seventh terminal are electrically coupled; and wherein the first reference voltage, the second reference voltage and the eighth terminal are connected to ground.

3. The filter circuit according to claim 2, further comprising:
a fourth capacitor having a seventh electrode and an eighth electrode, wherein the seventh electrode is electrically coupled to the fifth terminal;
a fifth inductor having a ninth terminal and a tenth terminal, wherein the ninth terminal is electrically coupled to the eighth electrode and the tenth terminal is electrically coupled to the seventh terminal;
a fifth capacitor having a ninth electrode and a tenth electrode, wherein the ninth electrode is electrically coupled to the first I/O terminal and the tenth electrode is electrically coupled to the eighth electrode; and
a sixth capacitor having an eleventh electrode and a twelfth electrode, wherein the eleventh electrode is electrically coupled to the second I/O terminal and the twelfth electrode is electrically coupled to the eighth electrode.

4. The filter circuit according to claim 2, wherein an inductance of the fourth inductor is 0.01~0.1 times an inductance of the first inductor or the second inductor.

5. A structure of the filter circuit recited as claim 1, comprising:
a substrate comprising a top surface, a bottom surface and a first side surface; and wherein the third inductor is disposed on the first side surface.

6. The structure of the filter circuit according to claim 5, further comprising three conductive layers.

7. The structure of the filter circuit according to claim 5, wherein the first capacitor, the second capacitor, the third capacitor, the first inductor and the second inductor are disposed on the top surface.

8. The structure of the filter circuit according to claim 7, further comprising a first soldering pad disposed on the bottom surface, wherein the sixth terminal of the third inductor is electrically coupled to the third reference voltage by the first soldering pad.

9. The structure of the filter circuit according to claim 8, further comprising a second soldering pad disposed on the bottom surface and a third soldering pad disposed on the bottom surface, wherein the first I/O terminal is electrically coupled to the second soldering pad and the second I/O terminal is electrically coupled to the third soldering pad.

10. The structure of the filter circuit according to claim 5, wherein an inductance of the third inductor is 0.01~0.1 times an inductance of the first inductor or the second inductor.

11. The structure of the filter circuit according to claim 7, further comprising a first conducting wire substantially on the first side surface, wherein the fifth terminal is electrically coupled to the second electrode and the fourth electrode via the first conducting wire.

12. A structure of the filter circuit recited as claim 2, comprising:
a substrate having a top surface, a bottom surface, a first side surface and a second side surface opposite to the first side surface, wherein the third inductor is disposed on the first side surface and the fourth inductor is disposed on the second side surface.

13. The structure of the filter circuit according to claim 12, wherein an inductance of the fourth inductor is 0.01~0.1 times an inductance of the first inductor or the second inductor.

14. The structure of the filter circuit according to claim 12, wherein the first capacitor, the second capacitor, the third capacitor, the first inductor and the second inductor are disposed on the top surface.

15. The structure of the filter circuit according to claim 14, further comprising a first soldering pad disposed on the bottom surface, wherein the sixth terminal and the eighth terminal are connected to ground by the first soldering pad.

16. The structure of the filter circuit according to claim 15, further comprising a second soldering pad disposed on the bottom surface and a third soldering pad disposed on the bottom surface, wherein the first I/O terminal is electrically coupled to the second soldering pad and the second I/O terminal is electrically coupled to the third soldering pad.

17. The structure of the filter circuit according to claim 12, further comprising three conductive layers.

18. The structure of the filter circuit according to claim 14, further comprising:
a first conducting wire substantially on the first side surface, wherein the fifth terminal is electrically coupled to the second electrode and the fourth electrode via the first conducting wire; and
a second conducting wire substantially on the second side surface opposite to the first side surface, wherein the seventh terminal is electrically coupled to the second terminal via the second conducting wire.

19. A filter circuit, comprising:
a first I/O terminal;
a second I/O terminal;
a first capacitor having a first electrode and a second electrode, wherein the first electrode is electrically coupled to the first I/O terminal;
a second capacitor having a third electrode and a fourth electrode, wherein the third electrode is electrically coupled to the second I/O terminal;
a third capacitor having a fifth electrode and a sixth electrode, wherein the fifth electrode is electrically coupled to the first I/O terminal and the sixth electrode is electrically coupled to the second I/O terminal;
a first inductor having a first terminal and a second terminal, wherein the first terminal is electrically coupled to the first I/O terminal and the second terminal is electrically coupled to a first reference voltage;
a second inductor having a third terminal and a fourth terminal, wherein the third terminal is electrically coupled to the second I/O terminal and the fourth terminal is electrically coupled to a second reference voltage; and
a third inductor having a fifth terminal and a sixth terminal, wherein the fifth terminal is electrically coupled to the second electrode and the fourth electrode, and the sixth terminal is electrically coupled to a third reference voltage;
wherein the first I/O terminal is an input terminal and the second I/O terminal is an output terminal, or the second I/O terminal is an input terminal and the first I/O terminal is an output terminal; and the frequency response of the filter circuit comprises a resonant frequency, a first notch on a lower frequency side of the frequency response and a second notch on a higher frequency side of the frequency response, wherein an inductance of the third inductor is 0.01~0.1 times an inductance of the first inductor or the second inductor.

20. A structure of a filter circuit, comprising:
a substrate comprising a top surface, a bottom surface, a first side surface and a second side surface;
a first conductive layer on the top surface;
a first dielectric layer on the first conductive layer;
a second conductive layer on the first dielectric layer;
a second dielectric layer on the second conductive layer;
a third conductive layer on the second dielectric layer;
wherein a first capacitor having a first electrode and a second electrode, a second capacitor having a third electrode and a fourth electrode and a third capacitor having a fifth electrode and a sixth electrode are constructed by the second conductive layer, the second dielectric layer and the third conductive layer, wherein the first electrode, the third electrode, the fifth electrode and the sixth electrode are on the second conductive layer, and the second electrode and the fourth electrode are on the third conductive layer; and wherein the first electrode is electrically coupled to a first I/O terminal via the first conductive layer, and the third electrode is electrically coupled to a second I/O terminal via the first conductive layer, wherein the fifth electrode is electrically coupled to the first I/O terminal via the first conductive layer, and the sixth electrode is electrically coupled to the second I/O terminal via the first conductive layer;
a first inductor having a first terminal and a second terminal and a second inductor having a third terminal and a fourth terminal are disposed on the second conductive layer, wherein the first terminal is electrically coupled to the first I/O terminal via the first conductive layer, and the third terminal is electrically coupled to the second I/O terminal via the first conductive layer, and wherein the second terminal and the fourth terminal are electrically coupled to a first reference voltage; and a third inductor having a fifth terminal and a sixth terminal disposed on the first side surface, wherein the fifth terminal is electrically coupled to the second electrode and the fourth electrode, and the sixth terminal is electrically coupled to a second reference voltage.

21. The structure of the filter circuit according to claim 20, further comprising a fourth inductor disposed on the second side surface opposite to the first side surface, the fourth inductor has a seventh terminal and an eighth terminal, wherein the second terminal, fourth terminal and the seventh terminal are electrically coupled; and wherein the first reference voltage, the second reference voltage and the eighth terminal are connected to ground.

22. The structure of the filter circuit according to claim 21, further comprising a first soldering pad disposed on the bottom surface, wherein the sixth terminal and the eighth terminal are connected to ground by the first soldering pad.

23. The structure of the filter circuit according to claim 20, wherein the first capacitor and the second capacitor are disposed symmetrically with each other.

24. The structure of the filter circuit according to claim 20, wherein the first inductor and the second inductor are disposed symmetrically with each other.

25. The structure of the filter circuit according to claim 20, wherein at least one of the first conductive layer, the first dielectric layer, the second conductive layer, the second dielectric and the third conductive layer is performed by film process.

\* \* \* \* \*